(12) United States Patent
Jeon et al.

(10) Patent No.: US 6,372,594 B2
(45) Date of Patent: Apr. 16, 2002

(54) FABRICATION METHOD OF SUBMICRON GATE USING ANISOTROPIC ETCHING

(75) Inventors: Soo Kun Jeon, Chun Ra Book-Do; Moon Jung Kim, Kyung Sang Book-Do; Kyoung Hoon Yang; Young Se Kwon, both of Taejon, all of (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 0 days.

(21) Appl. No.: 09/749,785

(22) Filed: Dec. 28, 2000

(30) Foreign Application Priority Data

Mar. 29, 2000 (KR) .............................................. 00-16066

(51) Int. Cl.[7] .............................................. H01L 21/331
(52) U.S. Cl. ........................ 438/321; 438/312; 438/170
(58) Field of Search ................................ 438/321, 312, 438/320, 183, 172, 167, 309, 170

(56) References Cited

U.S. PATENT DOCUMENTS 4,980,312 A  * 12/1990 Harris et al.
5,252,500 A  * 10/1993 Sato
5,389,554 A  *  2/1995 Liu et al.
6,310,368 B1 * 10/2001 Yagura ........................ 257/197

* cited by examiner

Primary Examiner—Tuan H. Nguyen
(74) Attorney, Agent, or Firm—Bacon & Thomas

(57) ABSTRACT

Disclosed is a method for fabricating a self-aligned submicron gate electrode using an anisotropic etching process. The method involves the steps of laminating a dummy emitter defining a dummy emitter region over a heterojunction bipolar transistor structure including layers sequentially formed over a semiconductor substrate to define a base region, an emitter region, and an emitter cap region, respectively, defining a line having a width of about 1 micron on the dummy emitter by use of a photoresist while using a contact aligner, selectively anisotropic etching the dummy emitter at a region where the line is defined, to allow the dummy emitter to have an etched portion having a bottom surface with a width less than the width of the line defined by the photoresist, and depositing a contact metal on the etched portion of the dummy emitter, thereby forming a gate. In accordance with the present invention, a reliable submicron gate can be fabricated using a simple anisotropic wet etch process and an inexpensive contact aligner. Accordingly, the manufacturing costs can be reduced. In the formation of a base electrode involved in the fabrication of an HBT device, the present invention also provides an effect of reducing the distance between a base and an emitter, thereby achieving a reduction in base resistance, by virtue of a self-alignment using a V-shaped submicron gate.

11 Claims, 5 Drawing Sheets

FABRICATION METHOD OF SUBMICRON GATE USING ANISOTROPIC ETCHING

BACKGROUND OF THE INVENTION

1. Field of the Invention

The present invention relates to a submicron gate electrode of a semiconductor device, and more particularly to a method for fabricating a self-aligned submicron gate electrode using an anisotropic etching process.

2. Description of the Related Art

Remarkable development recently made in radio communication fields has resulted in an increased demand for ultrahigh broadband communication networks. An exemplary one of such networks is a network for local multipoint distribution services in which audio, video conference, and digital signals are simultaneously transmitted at a bandwidth of 1.3 GHz within a service area of 2 to 7 Km in radius, using a 28 GHz "Ka-band". In order to construct such an ultrahigh broadband communication network, it is very important to develop ultrahigh-frequency devices operating the above mentioned frequency band while achieving a miniature and high performance of devices. To this end, active research efforts have been made. In particular, devices including submicron gates have been highlighted.

Conventional techniques associated with submicron gates are disclosed in U.S. Pat. No. 5,288,645 (entitled "Method of making a mushroom-shaped gate electrode of semiconductor device), and U.S. Pat. No. 5,053,348 (entitled "Fabrication of self-aligned, T-gate HEMT"). However, these techniques require an expensive exposure process, such as an electron beam writing process or a stepped exposure process, to form a submicron gate. Furthermore, these techniques involve execution of a number of semiconductor processes including repeated exposure, deposition and etching. In order to obtain a desired self-alignment of the submicron gate, diverse semiconductor processes for forming, for example, sidewalls, should be conducted.

Another conventional technique is known in association with submicron gates. For example, the following references discloses a method in which an electron beam writing process is repeatedly used to form a submicron gate, and sidewalls are formed using a dielectric material to obtain a self-alignment of the submicron gate.

[Reference]

1. A dielectric-defined process for the formation of T-gate field-effect transistors. G. M. Metze. IEEE MGWL. Vol. 1, No. 8, August 1991.

2. High-Frequency low power IC's in a scaled submicrometer HBT technology. IEEE MTT. Vol. 45, No. 12, December 1997.

However, this technique requires an expensive exposure process, such as an electron beam writing process or a stepped exposure process, or a complex process involving a formation of sidewalls, to form a self-aligned submicron gate. As a result, there is a drawback of an increase in the manufacturing costs.

SUMMARY OF THE INVENTION

Therefore, the present invention has been made in view of the above mentioned problems, and an object of the present invention is to provide a submicron gate fabrication method capable of fabricating a reliably self-aligned submicron gate using a simplified process.

In order to accomplish this object, the present invention provides a method for fabricating a submicron gate comprising the steps of: (a) laminating a dummy emitter defining a dummy emitter region over a heterojunction bipolar transistor structure including layers sequentially formed over a semiconductor substrate to define a base region, an emitter region, and an emitter cap region, respectively; (b) defining a line having a width of about 1 micron on the dummy emitter by use of a photoresist while using a contact aligner; (c) selectively anisotropic etching the dummy emitter at a region where the line is defined, to allow the dummy emitter to have an etched portion having a bottom surface with a width less than the width of the line defined by the photoresist; and (d) depositing a contact metal on the etched portion of the dummy emitter, thereby forming a gate.

A contact metal is deposited over the resulting structure with the gate, thereby self-aligning the gate.

In the formation of a base electrode involved in the fabrication of an HBT device, the present invention also provides an effect of reducing the distance between a base and an emitter as much as possible, thereby achieving a reduction in base resistance, in that it enables a self alignment using a V-shaped submicron gate.

BRIEF DESCRIPTION OF THE DRAWINGS

The above objects, and other features and advantages of the present invention will become more apparent after a reading of the following detailed description when taken in conjunction with the drawings, in which.

DESCRIPTION OF THE PREFERRED EMBODIMENTS

Now, a preferred embodiment of the present invention will be described in detail, with reference to the annexed drawings.

FIGS. 1 to 9 illustrate sequential steps of a submicron gate fabrication and self-alignment procedure according to an embodiment of the present invention, respectively.

Figure 1:
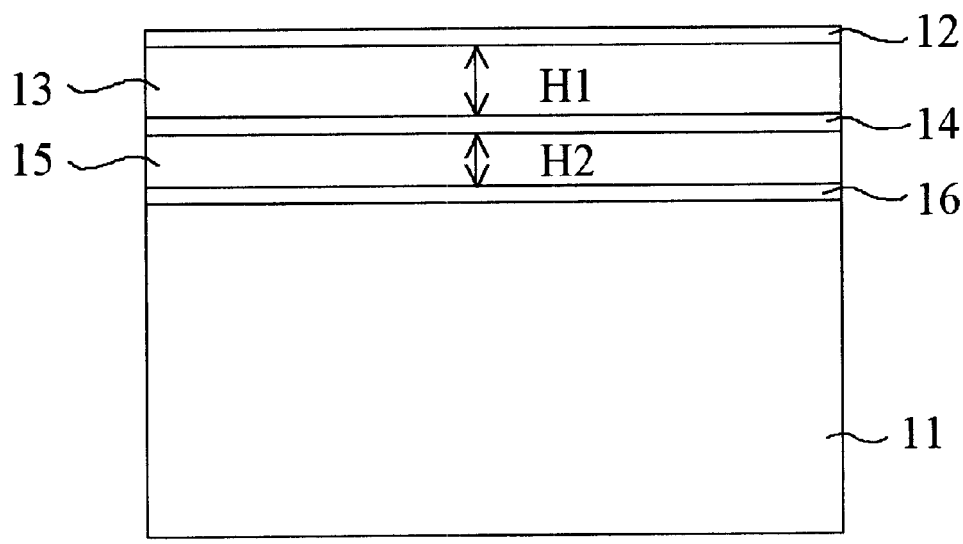
FIG. 1 is a cross-sectional view illustrating an essential laminated structure according to the embodiment of the present invention.

FIG. 1 illustrates an essential laminated structure according to the embodiment of the present invention in which a dummy emitter is laminated on a general InP/InGaAs heterojunction bipolar transistor (HBT) structure. As shown in FIG. 1, this structure is formed by laminating InGaAs layers (12, 14, and 16), and InP layers (13 and 15) over a Fe-doped InP substrate (11) in an alternating fashion, using a laminated growth equipment such as MOCVD or MBE.

The second InP layer (15) defines an emitter region, the second InGaAs layer (14) an emitter cap region, and the third InGaAs layer (16) a base region, respectively. The first InGaAs layer (12) and the first InP layer (13) define dummy emitter regions, respectively. The first InP layer (13) has a thickness H1 more than the thickness H2 of the second InP layer (15) in order to obtain a self-aligned structure. That is, this thickness relation is adapted to satisfy a condition of "L2<L3<L1" in FIG. 8.

Figure 2:
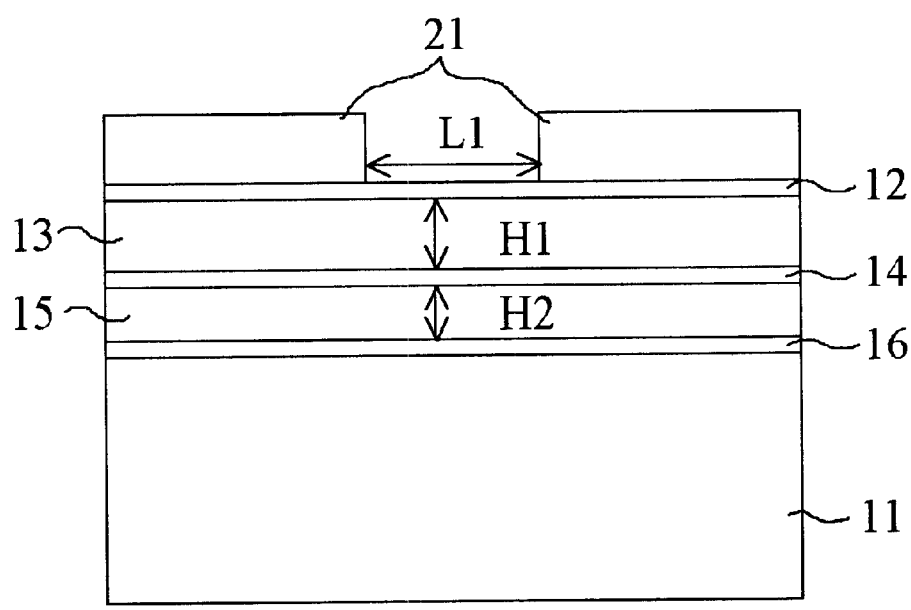
FIG. 2 is a cross-sectional view illustrating a structure obtained after patterning a photoresist (21) using a conventional contact aligner.

In order to define a region where a gate is to be formed, a line having a width L1 of about 1 $\mu$m is then patterned on the structure of FIG. 1 using a photoresist (21), as shown in FIG. 2. The line width L1 is limited by the resolution of a contact aligner.

Figure 3:
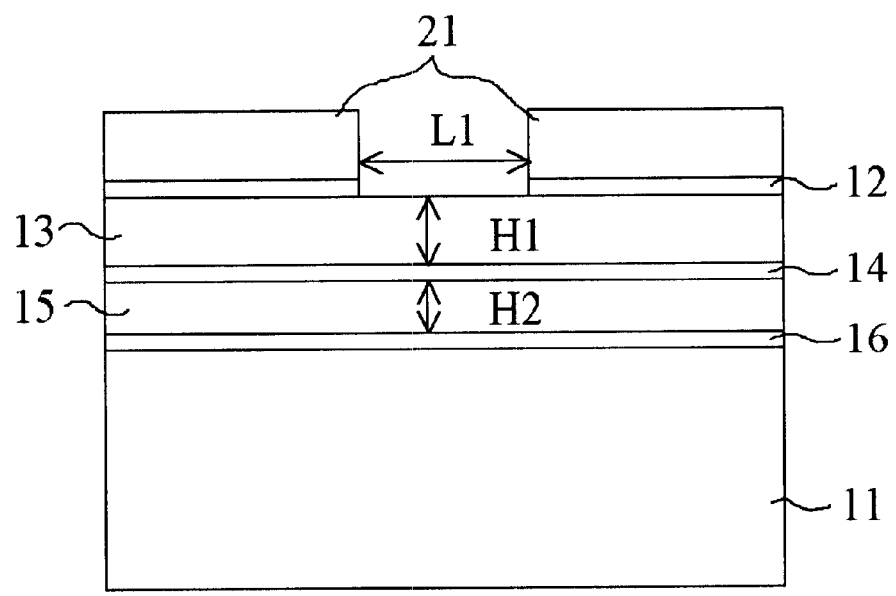
FIG. 3 is a cross-sectional view illustrating a structure obtained after selectively wet-etching a first InGaAs layer (12)

Thereafter, the first InGaAs layer (12) is selectively etched under the condition in which the patterned photoresist (21) formed at the step of FIG. 2 is used as a mask, as shown in FIG. 3. $H_3PO_4$:$H_2O_2$:$H_2O$ is used as an etchant in order to achieve the selective etching of the first InGaAs layer (12) without any substantial influence on the first InP layer (13).

Figure 4:
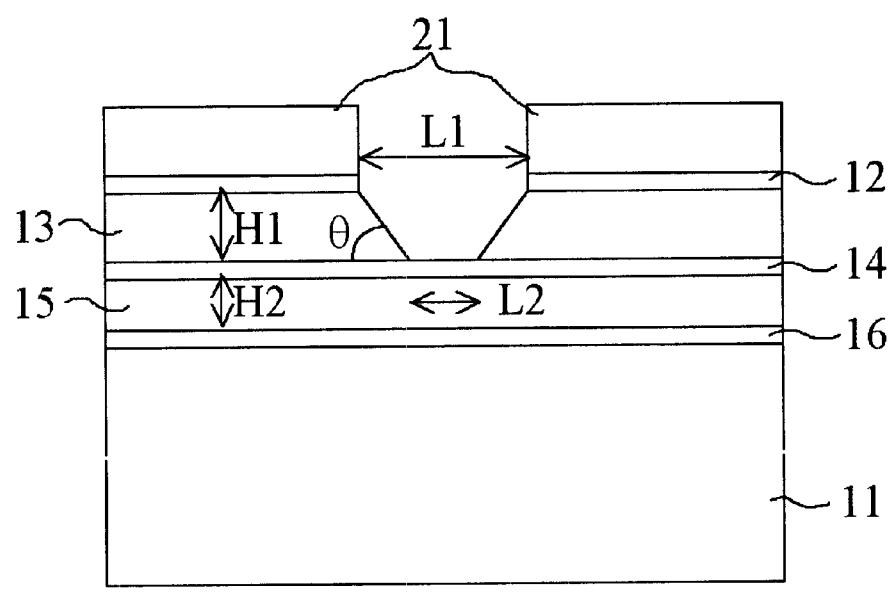
FIG. 4 is a cross-sectional view illustrating a structure obtained after selectively wet-etching a first InP layer (13)

The first InP layer (13) is then etched, as shown in FIG. 4. At this etching step, HCl:$H_3PO_4$ is used as an etchant in order to achieve the selective etching of the first InP layer (13) without any substantial influence on the first and second InGaAs layer (12 and 14). Referring to FIG. 4, it can be found that the first InP layer (13) exhibits anisotropic etch characteristics due to an etch selectivity difference resulting from a variation in lattice direction in the first InP layer (13). That is, the first InP layer (13) is not isotropically etched, but anisotropically etched in accordance with the variation in lattice direction, so that it has an inclined etch cross section.

Where the etching of the first InP layer (13) is carried out under the condition in which the first InGaAs layer (12) is used as a mask, as shown in FIG. 4, it is begun from the region where the first InGaAs layer (12) is opened, and then anisotropically progressed along the depth of the first InP layer (13) so that the etch cross section of the first InP layer (13) has an inclination $\theta$. The etching of the first InP layer (13) is stopped by the second InGaAs layer (14), so that the second InGaAs layer (14) and the second InP layer (15) are hardly etched.

The inclination $\theta$ is determined by the kind, concentration, and temperature of the etchant used.

The bottom width of the etch cross section, L2, is determined by the line width L1, the thickness of the first InP layer (13), H1, and the inclination $\theta$. That is, the bottom width L2 corresponds to "L1−2×H1/tan $\theta$" (L2=L1−2×H1/tan $\theta$). Accordingly, L2 of a submicron unit can be appropriately defined by adjusting L1, H1, and $\theta$.

Figure 5:
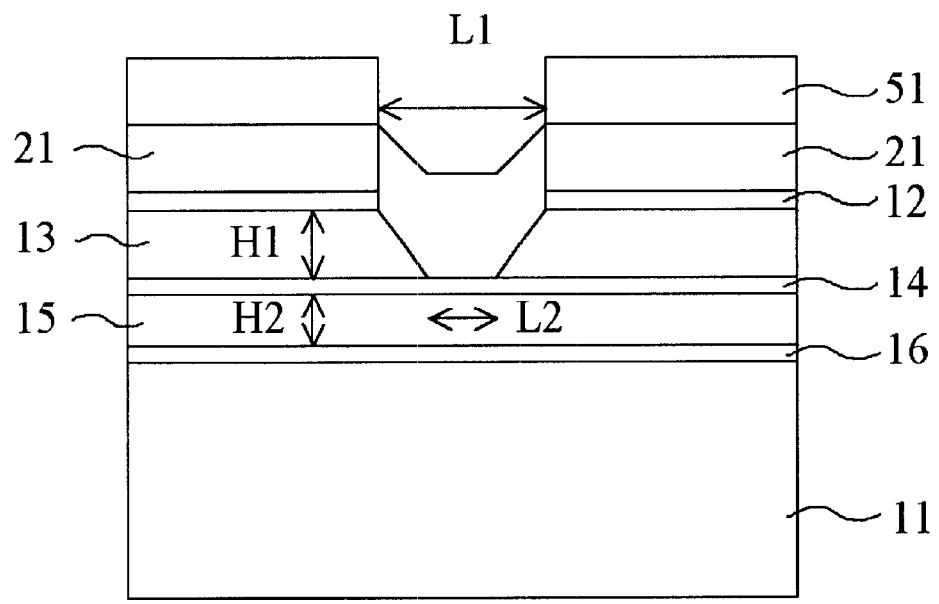
FIG. 5 is a cross-sectional view illustrating a structure obtained after depositing a metal (51) over the entire upper surface of the structure shown in FIG. 4, for the formation of a gate.

Subsequently, a contact metal (51) is deposited over the entire upper surface of the structure obtained at the step of FIG. 4, using an electron-beam evaporator or a thermal evaporator, as shown in FIG. 5. At this time, the contact metal (51) has a V-shaped structure at a portion thereof deposited at the region where the first InP layer (13) is etched. The V-shaped structure of the contact metal (51) has an inclination corresponding to the inclination formed by the anisotropic etching of the first InP layer (13).

Figure 6:
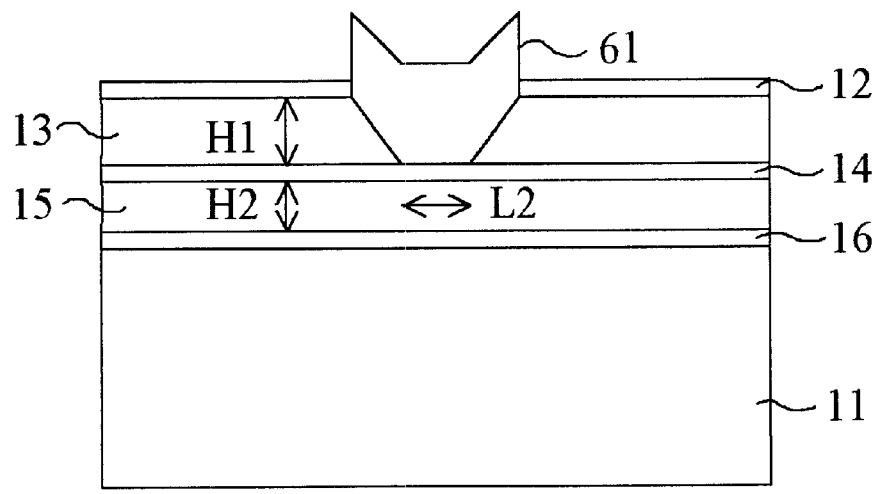
FIG. 6 is a cross-sectional view illustrating a structure obtained to have a V-shaped gate after lifting off the photoresist (21)

Thereafter, the portion of the contact metal (51) arranged on the photoresist (21) is lifted off along with the photoresist (21), as shown in FIG. 6.

Figure 7:
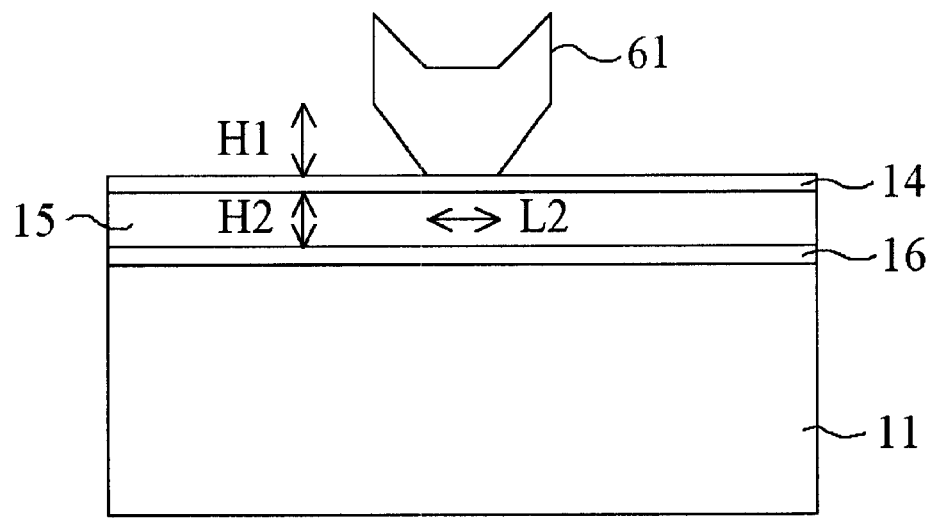
FIG. 7 is a cross-sectional view illustrating a structure obtained after sequentially removing the first InGaAs layer (12) and first InP layer (13)

Following the lift-off process, the first InGaAs layer (12) and first InP layer (13) are selectively etched, thereby forming a gate (61) made of the remaining contact metal (51), as shown in FIG. 7. Using the gate (61) as a mask, the second InGaAs layer (14) and second InP layer (15) arranged beneath the gate (61) are then sequentially etched in accordance with an anisotropic wet etch process. For the etching of the first and second InGaAs layer (12 and 14), $H_3PO_4$:$H_2O_2$:$H_2O$ is used as an etchant whereas HCl:$H_3PO_4$ is used as an etchant for the first and second InP layers (13 and 15). After the completion of the etching steps, an inclined structure made of the second InP layer (15) is obtained which has an inclination resulting from a variation in etch selectivity exhibited in the second InP layer (15). The bottom width of the inclined structure, L3, is also determined by the line width L1, the inclination $\theta$, and the thickness of the second InP layer (15), H2. That is, the bottom width L3 corresponds to "L2+2×H2/tan $\theta$" (L3=L2+2×H2/tan $\theta$). Since H2 is less than H1, L3 is more than L2 even though it is less than L1. Of course, the inclination $\theta$ associated with L3 corresponds to the inclination $\theta$ associated with L2.

Thus, the gate (61) has a self-aligned structure in that its region includes the region defined by L3.

Figure 8:
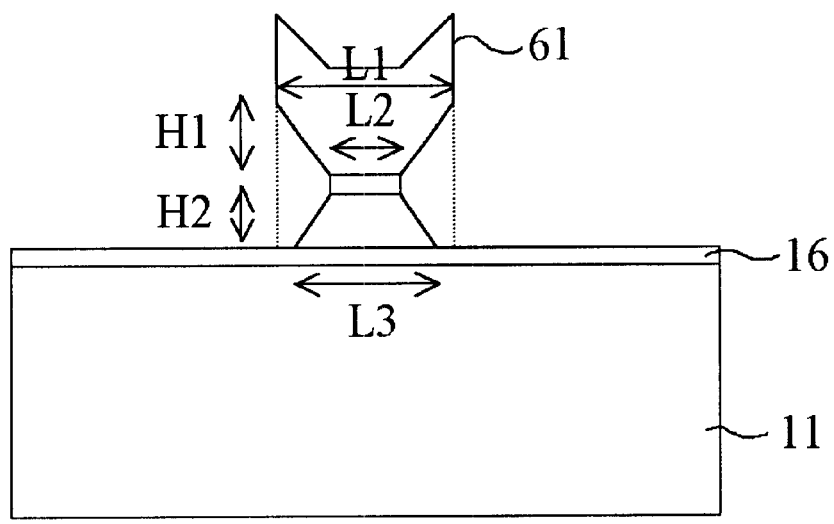
FIG. 8 is a cross-sectional view illustrating a structure obtained after anisotropically wet-etching a second InGaAs layer (14) and a second InP layer (15) using the V-shaped gate (61), formed in a process of FIG. 7, as a mask.
Figure 9:
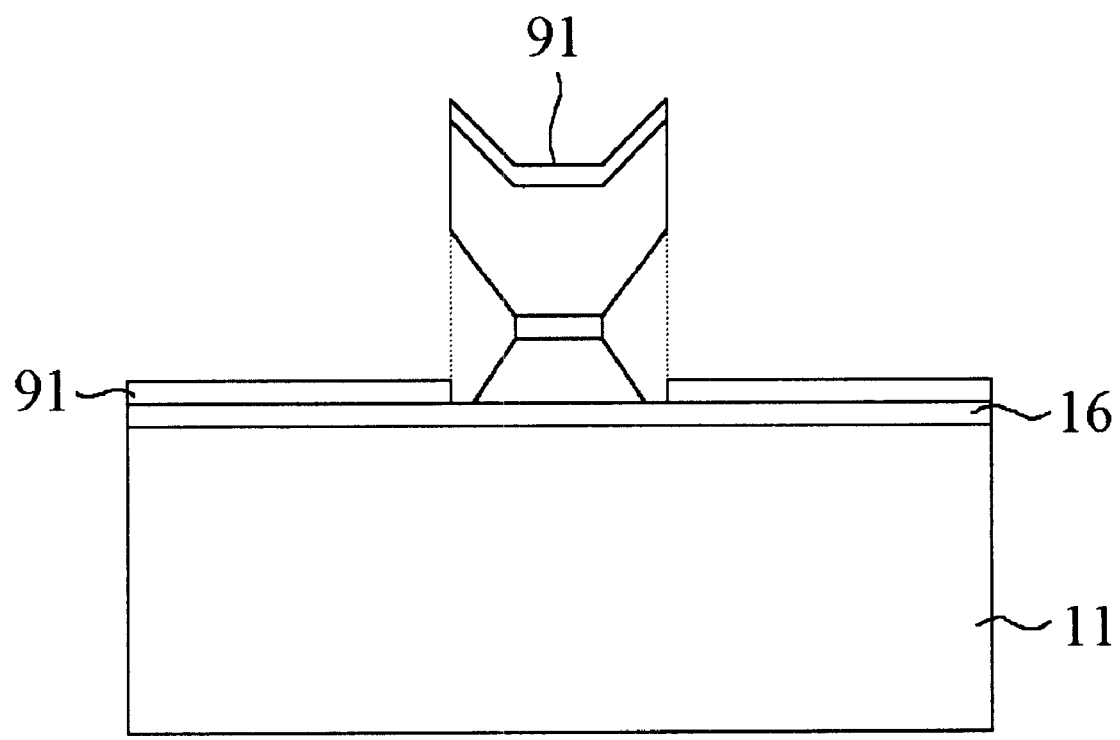
FIG. 9 is a cross-sectional view illustrating a final device produced after a self-alignment of the gate.

Finally, a contact metal (91) is deposited over the structure obtained after the process of FIG. 8, for a self-alignment of the gate, as shown in FIG. 9.

As apparent from the above description, in accordance with the present invention, the fabrication of a submicron gate is carried out using the existing exposure process such as an anisotropic wet etch process without use of any separate equipment. Accordingly, it is possible to simplify the fabrication of the submicron gate, thereby achieving a reduction in the manufacturing costs.

In the formation of a base electrode involved in the fabrication of an HBT device, the present invention also provides an effect of reducing the distance between a base and an emitter as much as possible, thereby achieving a reduction in base resistance, in that it enables a self-alignment using a V-shaped submicron gate.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a submicron gate comprising the steps of:

(a) laminating a dummy emitter defining a dummy emitter region over a heterojunction bipolar transistor structure including layers sequentially formed over a semiconductor substrate to define a base region, an emitter region, and an emitter cap region, respectively;

(b) defining a line having a width of about 1 micron on the dummy emitter by use of a photoresist while using a contact aligner;

(c) selectively anisotropic etching the dummy emitter at a region where the line is defined, to allow the dummy emitter to have an etched portion having a bottom surface with a width less than the width of the line defined by the photoresist; and (d) depositing a contact metal on the etched portion of the dummy emitter, thereby forming a gate.

2. The method according to claim 1, further comprising the step of:

(e) depositing a contact metal over a structure obtained after completion of the step (d), thereby self-aligning the gate.

3. The method according to claim 2, wherein the dummy emitter formed at the step (a) has a thickness more than the thickness of the layer defining the emitter region.

4. The method according to claim 2, wherein the bottom width of the etched dummy emitter portion formed at the step (c) is adjusted to have a submicron unit in accordance with an adjustment for the width of the line defined by the photoresist, the thickness of the dummy emitter, and an etch inclination of the etched dummy emitter portion resulting from the anisotropic etching.

5. The method according to claim 2, wherein the step (a) comprises the steps of:

preparing an InP substrate as the semiconductor substrate; and laminating first through third InGaAs layers and first and second InP layers over the InP substrate in an alternating fashion to define the base region by the third InGaAs layer arranged just above the InP substrate, the emitter region by the second InP layer arranged just above the third InGaAs layer, the emitter cap region by the second InGaAs layer arranged just above the second InP layer, and the dummy emitter region by the first InP layer and the first InGaAs layer arranged over the second InGaAs layer.

6. The method according to claim 2, wherein the step (d) comprises the steps of:

depositing a contact metal over a structure obtained after completion of the step (c);

lifting off a portion of the contact metal arranged on the photoresist, along with the photoresist;

selectively etching the dummy emitter, thereby forming the gate; and selectively anisotropic etching portions of the heterojunction bipolar transistor structure respectively corresponding to the emitter cap region and the emitter region while using the gate as a mask, thereby allowing the gate to have a self-aligned structure.

7. The method according to claim 1, wherein the dummy emitter formed at the step (a) has a thickness more than the thickness of the layer defining the emitter region.

8. The method according to claim 1, wherein the bottom width of the etched dummy emitter portion formed at the step (c) is adjusted to have a submicron unit in accordance with an adjustment for the width of the line defined by the photoresist, the thickness of the dummy emitter, and an etch inclination of the etched dummy emitter portion resulting from the anisotropic etching.

9. The method according to claim 1, wherein the step (a) comprises the steps of:

preparing an InP substrate as the semiconductor substrate; and laminating first through third InGaAs layers and first and second InP layers over the InP substrate in an alternating fashion to define the base region by the third InGaAs layer arranged just above the InP substrate, the emitter region by the second InP layer arranged just above the third InGaAs layer, the emitter cap region by the second InGaAs layer arranged just above the second InP layer, and the dummy emitter region by the first InP layer and the first InGaAs layer arranged over the second InGaAs layer.

10. The method according to claim 1, wherein the step (d) comprises the steps of:

depositing a contact metal over a structure obtained after completion of the step (c);

lifting off a portion of the contact metal arranged on the photoresist, along with the photoresist;

selectively etching the dummy emitter, thereby forming the gate; and selectively anisotropic etching portions of the heterojunction bipolar transistor structure respectively corresponding to the emitter cap region and the emitter region while using the gate as a mask, thereby allowing the gate to have a self-aligned structure.

11. The method according to claim 10, wherein the emitter region defining layer left after the selective anisotropic etching of the hetero bipolar transistor structure has a bottom width less than the width of the line defined by the photoresist while being more than the bottom width of the etched portion formed at the step (c), in accordance with an adjustment for the width of the line defined by the photoresist, the thickness of the emitter defining layer, and an etch inclination of the etched dummy emitter portion resulting from the anisotropic etching at the step (c).

* * * * *